(12) United States Patent
Miyanari

(10) Patent No.: US 8,882,930 B2
(45) Date of Patent: Nov. 11, 2014

(54) METHOD FOR PROCESSING PROCESS-TARGET OBJECT

(75) Inventor: Atsushi Miyanari, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 674 days.

(21) Appl. No.: 13/151,624

(22) Filed: Jun. 2, 2011

(65) Prior Publication Data

US 2011/0297190 A1 Dec. 8, 2011

(30) Foreign Application Priority Data

Jun. 4, 2010 (JP) ................................. 2010-128903

(51) Int. Cl.
*B08B 7/00* (2006.01)
*H01L 21/02* (2006.01)

(52) U.S. Cl.
CPC .............................. *H01L 21/02076* (2013.01)
USPC .................................. 134/33; 134/32; 134/34

(58) Field of Classification Search
None
See application file for complete search history.

(56) References Cited

U.S. PATENT DOCUMENTS

| | | |
|---|---|---|
| 2002/0189641 A1 | 12/2002 | Sato |
| 2004/0031503 A1 | 2/2004 | Eitoku |
| 2005/0173064 A1 | 8/2005 | Miyanari |
| 2007/0151674 A1 | 7/2007 | Miyanari |
| 2007/0277856 A1 | 12/2007 | Hashizume |
| 2009/0056767 A1 | 3/2009 | Iwata |
| 2010/0037916 A1 | 2/2010 | Iwata et al. |
| 2010/0051068 A1 | 3/2010 | Miyanari |

FOREIGN PATENT DOCUMENTS

| | | |
|---|---|---|
| JP | 11-307492 | 11/1999 |
| JP | 2003-1199 | 1/2003 |
| JP | 2004-79755 | 3/2004 |
| JP | 2005-32819 | 2/2005 |
| JP | 2005-93694 | 4/2005 |
| JP | 2006-93497 | 4/2006 |
| JP | 2006-135272 | 5/2006 |
| JP | 2007-324548 | 12/2007 |
| JP | 2008-140892 | 6/2008 |
| JP | 2008-140908 | 6/2008 |
| JP | 2009-59781 | 3/2009 |

OTHER PUBLICATIONS

JPO machine translation of JP 2008-140892 retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2008-140892 on Apr. 29, 2014.*
JPO machine translation of JP 2008-140908 retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2008-140908 on Apr. 30, 2014.*

* cited by examiner

*Primary Examiner* — Eric Golightly
(74) *Attorney, Agent, or Firm* — Wenderoth, Lind & Ponack, L.L.P.

(57) ABSTRACT

Provided is a method including the steps of: carrying out a storage process by causing a processing jig, which has a supply opening for supplying a first processing liquid, to be positioned such that a storage space section into which the supply opening is open is sandwiched by the processing jig and the process-target surface, and by storing the first processing liquid in the storage space section; and carrying out a rotation process by supplying the first processing liquid onto the process-target surface from the supply opening, while supplying a second processing liquid onto the outer peripheral part, in a state where the process-target object is being rotated, in the step for carrying out the rotation process, the processing jig being moved along a direction which is not a direction along which the process-target object is being rotated.

20 Claims, 8 Drawing Sheets

METHOD FOR PROCESSING PROCESS-TARGET OBJECT

This Nonprovisional application claims priority under 35 U.S.C. §119(a) on Patent Application No. 2010-128903 filed in Japan on Jun. 4, 2010, the entire contents of which are hereby incorporated by reference.

TECHNICAL FIELD

The present invention relates to a method for processing a process-target object (i.e., an object to be processed) by processing a surface of the process-target object with use of a processing liquid.

BACKGROUND ART

In recent years, there are demands for reducing thicknesses, sizes, weights, etc. of electronic devices such as IC cards and mobile phones. In order to meet the demands, semiconductor chips which are to be integrated into these electronic devices must be thin. A current semiconductor wafer, which constitutes a base of a semiconductor chip, has a thickness (film thickness) within a range from 125 µm to 150 µm; however, for a next-generation chip, it is said that a semiconductor wafer must have a film thickness within a range from 25 µm to 50 µm. In order to obtain a semiconductor wafer whose film thickness is within this range, a step for thinning a semiconductor wafer is indispensable. The step for thinning the semiconductor wafer is carried out, for example, as follows (see Patent Literature 1):

First, via a tape whose both sides have adhesive layers or an adhesive, a support plate for protecting a semiconductor wafer is bonded to the semiconductor wafer such that the support plate covers a circuit-formed surface of the semiconductor wafer. Next, the semiconductor wafer is turned over, and a back surface of the semiconductor wafer is ground by a grinder, so that the semiconductor wafer is thinned. Subsequently, the back surface of the thinned semiconductor wafer is fixed onto a dicing tape which is supported by a dicing frame. Then, in this state, the support plate, which covers the circuit-formed surface of the semiconductor wafer, is stripped off. Thereafter, the semiconductor wafer is divided into chips by a dicing device.

However, carrying out the thinning step in the above manner causes the adhesive and/or the like to remain on the circuit-formed surface of the semiconductor wafer after the support plate is stripped off. Therefore, the adhesive and/or the like stuck thereon must be removed in order to clean the circuit-formed surface of the semiconductor wafer. Namely, after the support plate covering the circuit-formed surface of the semiconductor wafer is stripped off and before the semiconductor wafer is divided into chips by the dicing device, the surface of the semiconductor wafer needs to be subjected to a cleaning process in the state where the semiconductor wafer is fixed onto the dicing tape.

However, since the dicing tape has a surface area greater than that of the semiconductor wafer, an exposed surface of the dicing tape is located along the outer periphery of the semiconductor wafer. Therefore, with a generally-used cleaning process method such as (i) supplying a processing liquid while rotating the semiconductor wafer or (ii) immersing the semiconductor wafer into a processing liquid, the processing liquid processes not only the surface of the semiconductor wafer but also the exposed surface of the dicing tape. Further, depending on the type of the processing liquid used in this process, the dicing tape may be deteriorated.

In order to address this, there have been developed some techniques for preventing the outer peripheral part (e.g., the exposed surface of the dicing tape) of the process-target surface (i.e., the surface to be processed) from being processed by the processing liquid which is used to process the process-target surface (see Patent Literatures 2 and 3).

Patent Literature 2 describes a technique for storing a processing liquid in a processing jig mounted onto a process-target surface, in order to process only the process-target surface by the processing liquid.

Patent Literature 3 describes a technique for supplying a first processing liquid to a substantial boundary between a process-target surface and its outer peripheral part while supplying a second processing liquid to the process-target surface, so that the outer peripheral part is protected from the second processing liquid by the first processing liquid, in order to process the process-target surface by the second processing liquid while preventing the outer peripheral part from being processed by the second processing liquid, which is used to process the process-target surface.

CITATION LIST

Patent Literatures

Patent Literature 1
Japanese Patent Application Publication, Tokukai, No. 2006-135272 A (Publication Date: May 25, 2006)
Patent Literature 2
Japanese Patent Application Publication, Tokukai, No. 2008-140892 A (Publication Date: Jun. 19, 2008)
Patent Literature 3
Japanese Patent Application Publication, Tokukai, No. 2008-140908 A (Publication Date: Jun. 19, 2008)

SUMMARY OF INVENTION

Technical Problem

However, in a case where the adhesive adhered onto the surface of the semiconductor wafer is dissolved in a solvent, dissolution residual derived from contamination, a filler in the adhesive, and/or the like may remain on the surface of the semiconductor wafer. In order to adequately remove the dissolution residual, such a technique is required which processes the process-target surface more effectively than the conventional techniques while preventing the outer peripheral part of the process-target surface from being processed by the processing liquid which is used to process the process-target surface.

The present invention was made in view of such the circumstances, and a main object of the present invention is to provide a technique for processing a process-target surface more effectively while preventing an outer peripheral part of the process-target surface from being processed by a processing liquid which is used to process the process-target surface.

Solution to Problem

In order to attain the above object, a method of the present invention for processing a process-target object is a method for processing a process-target object, the process-target object having a process-target surface and an outer peripheral part which is provided along an outer periphery of the process-target surface, said method including the steps of: carrying out a storage process by causing a processing jig, which has a supply opening for supplying a first processing liquid, to be positioned such that a space into which the supply opening is open is sandwiched by the processing jig and the process-target surface, and by storing the first processing liquid in said space; and carrying out a rotation process by supplying the first processing liquid onto the process-target surface from the supply opening, while supplying a second processing liquid onto the outer peripheral part, in a state where the process-target object is being rotated, in the step for carrying out the rotation process, the processing jig being moved along a direction which is not a direction along which the process-target object is being rotated.

Advantageous Effects of Invention

As described above, in order to process a process-target object having a process-target surface and an outer peripheral part which is provided along an outer periphery of the process-target surface, a method of the present invention for processing a process-target object includes the steps of: carrying out a storage process by causing a processing jig, which has a supply opening for supplying a first processing liquid, to be positioned such that a space into which the supply opening is open is sandwiched by the processing jig and the process-target surface, and by storing the first processing liquid in said space; and carrying out a rotation process by supplying the first processing liquid onto the process-target surface from the supply opening, while supplying a second processing liquid onto the outer peripheral part, in a state where the process-target object is being rotated, in the step for carrying out the rotation process, the processing jig being moved along a direction which is not a direction along which the process-target object is being rotated. Therefore, it is possible to more effectively process the process-target surface by the first processing liquid, while preventing the outer peripheral part from being processed by the first processing liquid, which is used to process the process-target surface.

DESCRIPTION OF EMBODIMENTS

Embodiment 1

Figure 1:
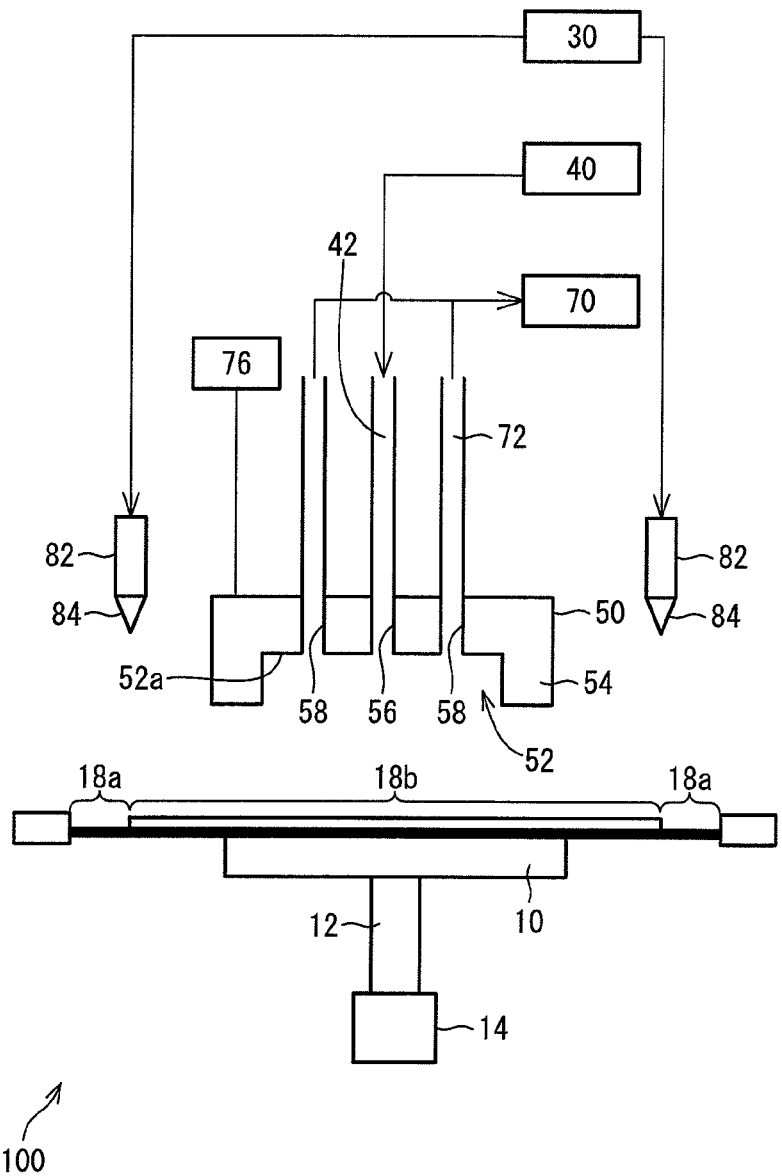
FIG. 1 shows a cross-section view schematically illustrating a configuration of one example of a processing device which carries out a method of the present invention for processing a process-target object.

With reference to FIGS. 1 through 7, the following will describe a method of one embodiment of the present invention for processing a process-target object. As shown in FIG. 1, a process-target object 18, which is to be processed by the method of the present embodiment for processing the process-target object, has a process-target surface 18b and an outer peripheral part 18a which is provided along the outer periphery of the process-target surface 18b. According to the method of the present embodiment for processing the process-target object, it is possible to adequately process the process-target surface 18b while preventing the outer peripheral part 18a from being processed by a first processing liquid, which is used to process the process-target surface 18b.

(Process-Target Object)

Here, the following will describe one example of the process-target object 18 which is favorably processed by the method of the present embodiment for processing the process-target object. Needless to say, the process-target object 18 is not limited to the process-target object exemplified below.

The process-target object 18, which is favorably processed by the method of the present embodiment for processing the process-target object, is a semiconductor wafer 94 which is provided on the dicing tape 96, serving as a support, and is thinned. As a result of the thinning process, an adhesive may remain on a surface of the semiconductor wafer 94 thus thinned. A process for removing such a remaining adhesive 93 of the semiconductor wafer 94 can employ the method of the present embodiment for processing the process-target object.

Figure 6:
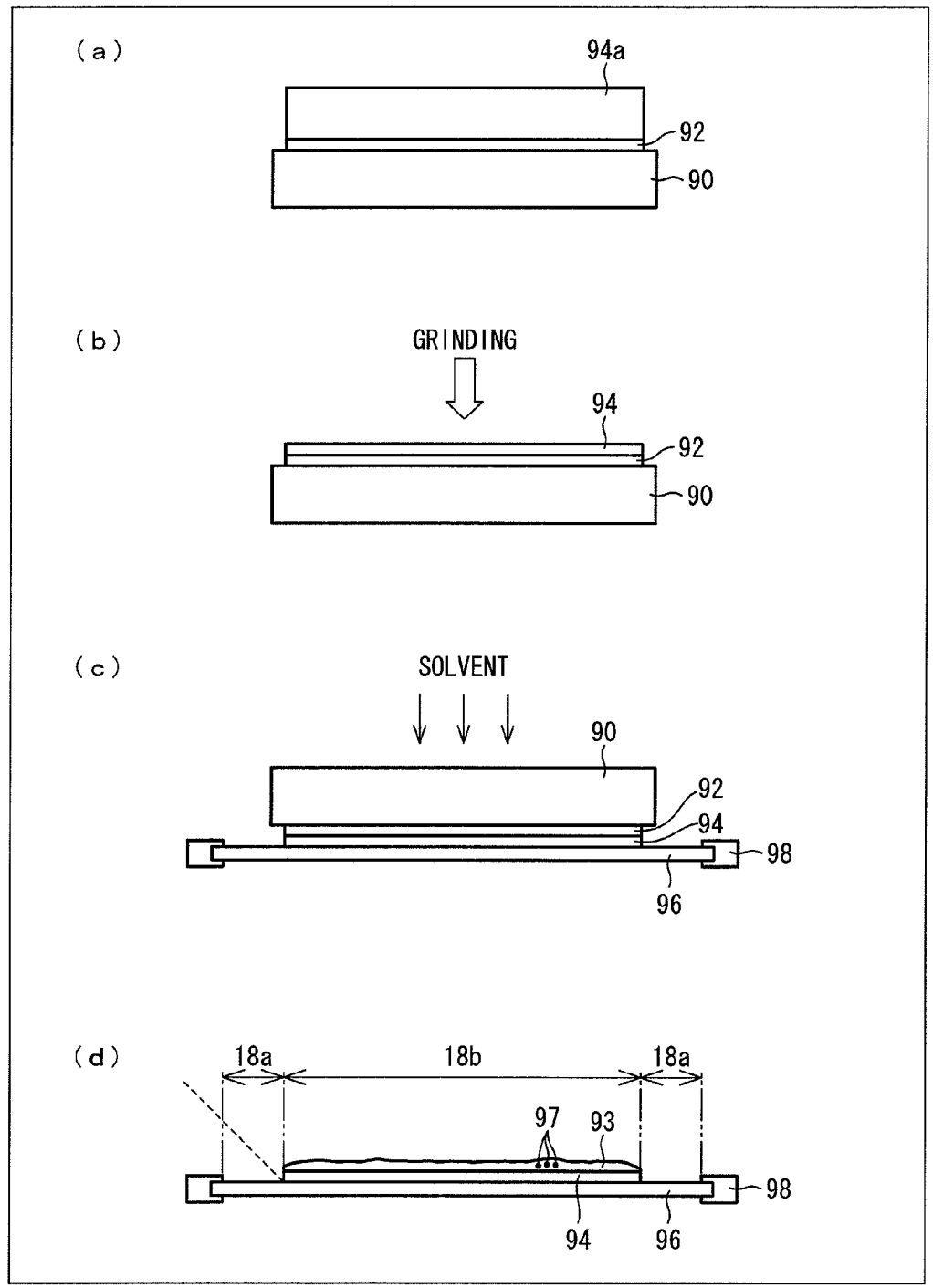
FIG. 6 shows cross-section views schematically illustrating a configuration of one example of a process-target object which is to be processed by the method of the present invention for processing the process-target object.
Figure 7:
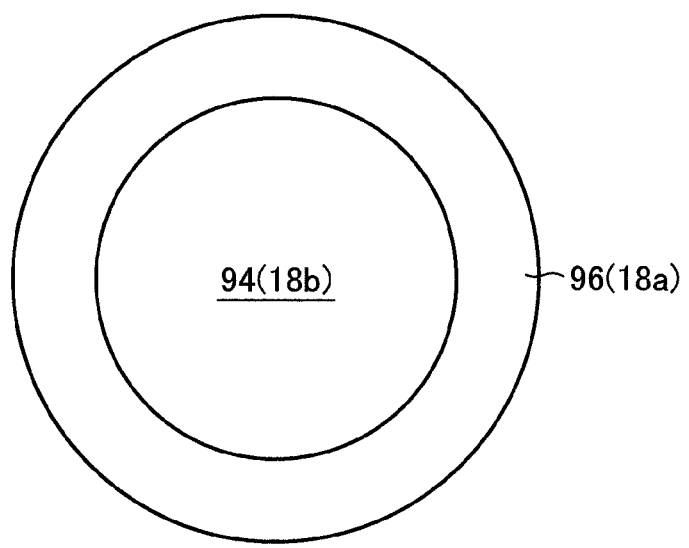
FIG. 7 shows a top view schematically illustrating the configuration of the one example of the process-target object which is to be processed by the method of the present invention for processing the process-target object.

The following descriptions first deal with, with reference to FIGS. 6 and 7, a process for thinning a semiconductor wafer, and then deal with advantages of use of the processing method of the present embodiment. (a) through (d) of FIG. 6 are cross-section views for explaining the process for thinning the semiconductor wafer. FIG. 7 is a plan view of the process-target object 18 which is obtained by the thinning process. The descriptions here deal with an example where a support plate 90 having a hole is used.

First, as shown in (a) of FIG. 6, the support plate 90 and a semiconductor wafer 94a are bonded to each other via an adhesive 92. Note that the semiconductor wafer 94a has not been thinned yet. Subsequently, as shown in (b) of FIG. 6, the semiconductor wafer 94a is ground, so as to provide a semiconductor wafer 94 which is thin. The semiconductor wafer 94a can be ground by any of publicly-known various techniques.

Next, as shown in (c) of FIG. 6, a surface of the semiconductor wafer 94 which surface is not in contact with the adhesive 92 is bonded to a dicing tape (support) 96. At this time, the dicing tape 96 functions to compensate for a strength of the semiconductor wafer 94 after the support plate 90 is stripped off therefrom and thus to make it easier to handle such the semiconductor wafer 94. Note that the dicing tape 96 is surrounded by a dicing frame (fixture) 98. The dicing frame 98 prevents loosening of the dicing tape 96. Then, a solvent for dissolving the adhesive 92 is supplied through the hole of the support plate 90, so that the adhesive 92 is dissolved. After that, the support plate 90 is removed. At this time, the adhesive 92 is not completely removed, and remains on the semiconductor wafer 94.

As shown in (d) of FIG. 6, the adhesive 92 thus remain is shown as a remaining adhesive 93. Thus, a lamination of (i)

the semiconductor wafer 94 having the remaining adhesive 93 and (ii) the dicing tape 96 corresponds to the process-target object 18.

FIG. 7 is a plan view illustrating the process-target object 18 formed in the above manner. As shown in FIG. 7, the semiconductor wafer 94 having the remaining adhesive 93 corresponds to the process-target surface 18b, and the dicing tape 96 provided along the outer periphery of the semiconductor wafer 94 corresponds to the outer peripheral part 18a. Note that, as shown in (d) of FIG. 6, the remaining adhesive 93 remaining on the process-target surface 18b of the semiconductor wafer 94 can contain dissolution residual 97, which is a component insoluble in the solvent and is derived from contamination, etc.

With the above-described process-target object 18, in order to successfully carry out a further process on the semiconductor wafer 94, the remaining adhesive 93 and/or the dissolution residual 97 stuck to the process-target surface 18b must be removed so as to clean a circuit-formed surface of the semiconductor wafer 94. Further, if (i) a solvent (the below-described first processing liquid) for dissolving the remaining adhesive 93 or (ii) the dissolution residual 97 is stuck to the outer peripheral part 18a (an exposed surface of the dicing tape 96), the dicing tape 96 may be deteriorated. The deterioration of the dicing tape 96 may cause looseness, thereby leading to a crack of the semiconductor wafer which has been thinned and whose strength has been reduced. In order to avoid this, it is necessary to clean the surface of the semiconductor wafer without causing deterioration of the dicing tape 96. According to the method of the present embodiment for processing the process-target object, for example, it is possible to favorably process such the process-target object 18.

(Processing Device)

FIG. 1 is a cross-section view schematically illustrating a configuration of a processing device 100 for carrying out the method of the present embodiment for processing the process-target object. As shown in FIG. 1, the processing device 100 includes a mounting section 10, a rotation shaft 12, a rotation motor 14, a first processing liquid supplying section 40, a pipe 42, a pipe 72, a processing jig 50, a first processing liquid collecting section 70, a position control section 76, a second processing liquid supplying section 30, a pipe 82, and a second processing liquid supply opening 84. The processing jig 50 has a supply opening 56 and a collection opening 58. Also, the processing jig 50 has a facing surface 52a which faces the process-target surface 18b. Details of each section will be described later. Note that the method of the present embodiment for processing the process-target object may be carried out by a device having a different configuration from that of the processing device 100, as long as the device can carry out the below-described steps.

According to the method of the present embodiment for processing the process-target object, after the process-target object 18 is accepted, a storage process step and a rotation process step are carried out on the process-target object 18, and the process-target object 18 thus processed is discharged.

As shown in FIG. 1, in the present embodiment, the process-target object 18 is accepted in such a manner that the process-target object 18 is placed on the mounting section 10. The mounting section 10 is the one on which the process-target object 18 is to be placed, and can hold the process-target object 18 by, e.g., sucking the process-target object 18. The mounting section 10 is provided on the rotation shaft 12 which can rotate around a center of the mounting section 10. The rotation shaft 12 is provided with the rotation motor (rotation means) 14 for rotating the rotation shaft 12.

Further, after the below-described storage process step and rotation process step are carried out and before the process-target object 18 which has been processed is discharged, the process-target object 18 may be rotated with no processing liquid supplied, so that the process-target surface 18b is dried. In this case, the process-target object 18 can be rotated at a rotating speed of, e.g., 500 min$^{-1}$ or more and not more than 3000 min$^{-1}$.

(Storage Process Step)

Figure 2:
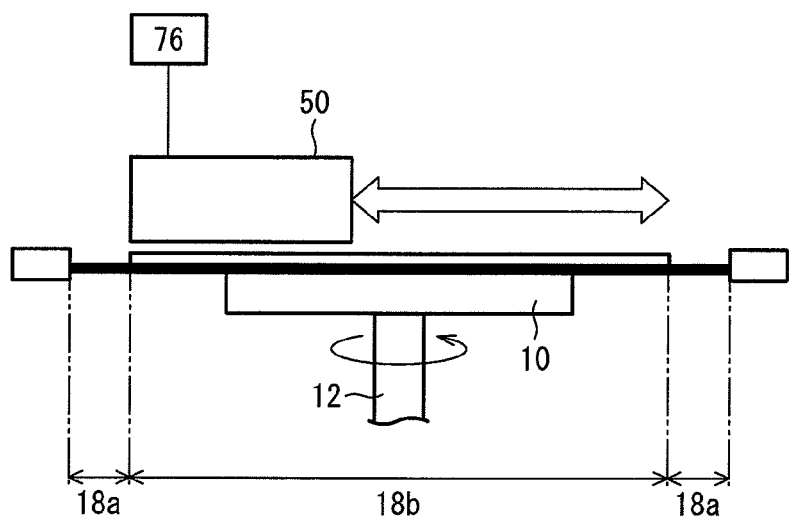
FIG. 2 shows a cross-section view schematically illustrating a main part of the processing device of FIG. 1 in a storage process step.

FIG. 2 is a cross-section view illustrating a state of the processing device 100 in the storage process step. As shown in FIG. 2, the first processing liquid is stored in a storage space section 52 in a state where the processing jig 50 is positioned such that the storage space section 52, into which the supply opening 56 is open, is sandwiched by the facing surface 52a and the process-target surface 18b. This makes it possible to process the process-target surface 18b while preventing the first processing liquid from being scattered to the outer peripheral part 18a.

Namely, in the storage process step, the position control section 76 positions the processing jig 50 such that the storage space section 52 is sandwiched by the facing surface 52a and the process-target surface 18b, and the first processing liquid supplying section 40 supplies the first processing liquid from the supply opening 56 to the storage space section 52.

The first processing liquid is a processing liquid used to process the process-target surface 18b, and is supplied from the supply opening 56 to the storage space section 52. As shown in FIG. 1, the supply opening 56 is connected via the pipe 42 to the first processing liquid supplying section 40 which supplies the first processing liquid. The first processing liquid supplying section 40 is provided with a tank (not illustrated) for holding the first processing liquid. Preferably, the first processing liquid supplying section 40 includes a structure capable of controlling a flow rate of the first processing liquid when the first processing liquid is supplied from the supply opening 56. This makes it possible to supply, from the supply opening 56, the first processing liquid with an optimum flow rate, thereby improving process effects.

The first processing liquid may be arbitrarily selected depending on the type of the intended process. For example, in the case where, as described above, the purpose is to clean away the adhesive remaining on the surface of the process-target object 18, which is the semiconductor wafer 94 bonded to the dicing tape 96, the first processing liquid can be a solvent which can favorably dissolve the adhesive. Such the solvent may be a hydrophilic solvent or a hydrophobic solvent. Examples of the hydrophilic solvent encompass aqueous alkaline solutions and alcohols such as methanol and isopropyl alcohol. Examples of the hydrophobic solvent encompass glycol solvents such as propyleneglycol monomethylether acetate and terpene solvents such as p-menthane and d-limonene.

Further, as shown in FIG. 1, the processing jig 50 preferably includes a projection 54 protruding from the facing surface 52a, which faces the process-target surface 18b, toward the process-target surface 18b. Thanks to the projection 54, it is possible to allow the storage space section 52 to more reliably hold the first processing liquid supplied thereto. Supplementarily, according to one aspect, the storage process step utilizes surface tension of the first processing liquid to hold the first processing liquid in the storage space section 52.

In the storage process step, a distance between the processing jig 50 and the process-target surface 18b only needs to allow the first processing liquid to be held. For example, the distance between the processing jig 50 and the process-target surface 18b in the storage process step is preferably 0.1 mm or more and not more than 3.0 mm, further preferably 0.3 mm or more and not more than 1.5 mm. Note that a distance between the projection 54 and the process-target surface 18b can be set to be close to 0, as long as the projection 54 and the process-target surface 18b do not come in contact with each other. The position control section 76 adjusts the position of the processing jig 50. In the storage process step, the position control section 76 maintains a state where the processing jig 50 and the process-target surface 18b do not come in contact with each other, and the position control section 76 preferably maintains the distance between the processing jig 50 and the process-target surface 18b at a value in the above-described target range.

Further, the collection opening 58 is preferably open into the storage space section 52, so that the first processing liquid collecting section 70 collects, via the pipe 72 and the collection opening 58, the first processing liquid stored in the storage space section 52. With this, the first processing liquid supplied from the supply opening 56 and stored in the storage space section 52 is rapidly collected through the collection opening 58. This allows the storage space section 52 to be always filled with a fresh first processing liquid. This makes it possible to secure a higher cleaning effect.

As shown in FIG. 1, the collection opening 58 is connected via the pipe 72 to the first processing liquid collecting section 70 which collects the first processing liquid. The first processing liquid collecting section 70 is provided with (i) a pump (not illustrated) for sucking the first processing liquid from the storage space section 52 and (ii) a tank (not illustrated) for storing the first processing liquid thus collected.

Figure 3:
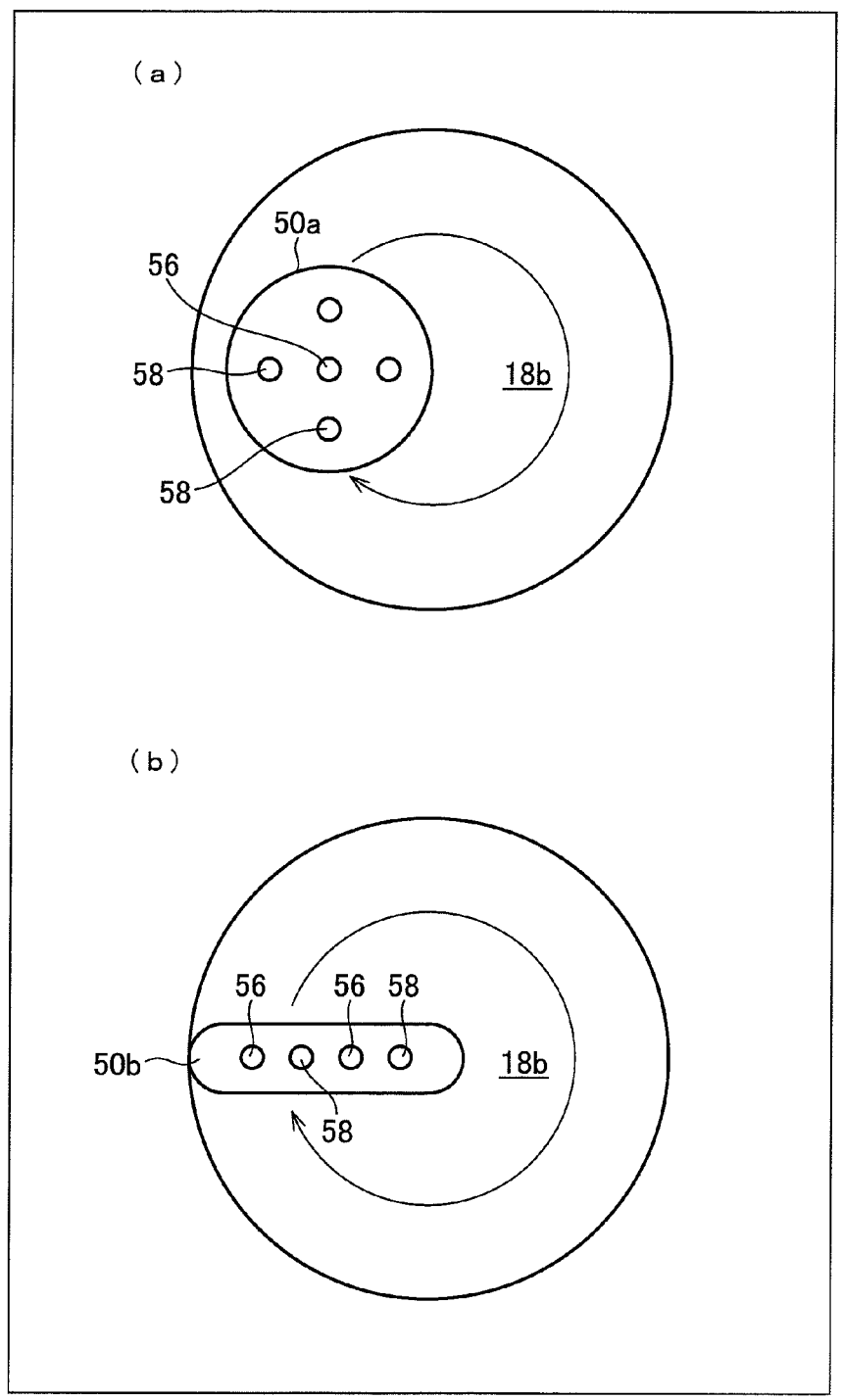
FIG. 3 shows top views schematically illustrating a main part of the processing device of FIG. 1 in the storage process step.

The numbers of and the positions of the supply opening(s) 56 and the collection opening(s) 58 can be arbitrarily set according to the size, the shape, etc. of the process-target object 18 (see (a) and (b) of FIG. 3). A shape of each of the supply opening 56 and the collection opening 58 viewed in a plan view can be a circle, an oval, a square, a rectangular, or a rhomb, and is not particularly limited as long as it does not interfere with flow of the first processing liquid. Also, an aperture of each of the supply opening 56 and the collection opening 58 is not particularly limited, as long as it does not interfere with flow of the processing liquid.

Further, a region of the process-target surface 18b which region is in contact with the storage space section 52, in other words, a region of the process-target surface 18b on which region the first processing liquid is stored may be smaller than the entire process-target surface 18b. In this case, in the storage process step, the processing jig 50 is preferably moved along a direction which is in parallel with the process-target surface 18b relatively to the process-target surface 18b. By shifting the position of the processing jig 50 relatively to the process-target surface 18b, it is possible to process a greater area of the process-target surface 18b.

For example, according to one embodiment, the process-target object 18 may be rotated as shown in FIG. 3. This allows the processing jig 50 to move relatively to the process-target surface 18b, so as to process a greater area of the process-target surface 18b. (a) of FIG. 3 is a top view seen in a case of using a processing jig 50 which is shaped in a circle. (b) of FIG. 3 is a top view seen in a case of using a processing jig 50 which is shaped in a circle extended along one direction.

In a further preferable embodiment, as shown in FIG. 2, in the storage process step, (i) the process-target object 18 is rotated, and (ii) the position control section 76 causes the processing jig 50 to move, in a plane which is in parallel with the process-target surface 18b, along a direction which is not a direction along which the process-target object 18 is being rotated. This allows the storage space section 52 to go through a greater area of the process-target surface 18b, thereby making it possible to process the greater area suitably.

Figure 4:
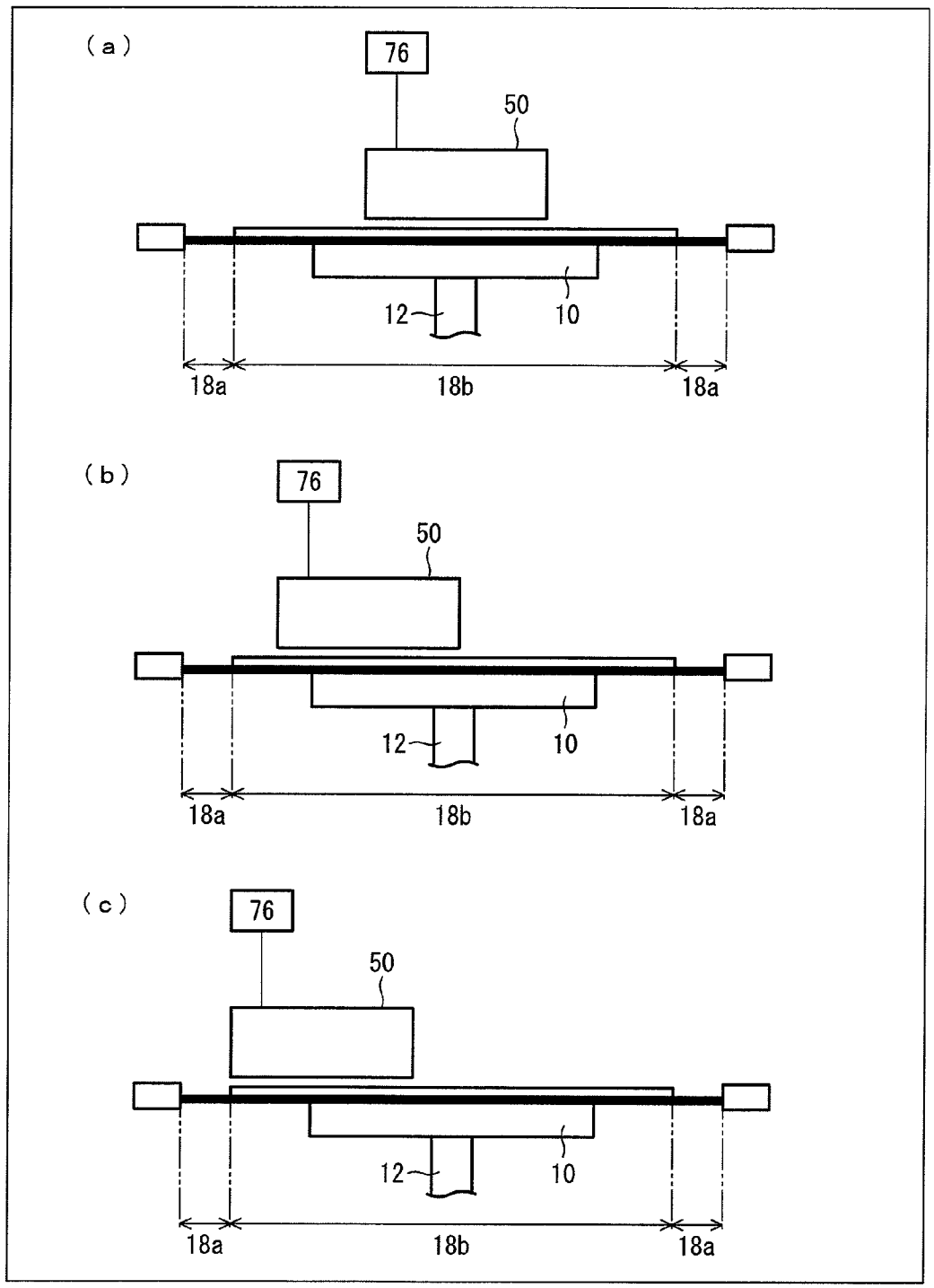
FIG. 4 shows cross-section views schematically illustrating a main part of the processing device of FIG. 1 in stages of the storage process step.

For example, as shown in (a) through (c) of FIG. 4, by carrying out the process in such a manner that the processing jig 50 is moved from a center of the process-target surface 18b to an outer edge of the process-target surface 18b, it is possible to process the entire process-target surface 18b. (a) of FIG. 4 shows a state (center process stage) where the processing jig 50 is positioned above the center of the process-target surface 18b; (b) of FIG. 4 shows a state (intermediate-part process stage) where the processing jig 50 is positioned above an intermediate part between the center of the process-target surface 18b and the outer edge of the process-target surface 18b; and (c) of FIG. 4 shows a state (outer-edge process stage) where the processing jig 50 is positioned above the outer edge of the process-target surface 18b. Note that the outer edge of the process-target surface 18b refers to a region of the process-target surface 18b which region is close to the outer peripheral part 18a. A processed area of the process-target surface 18b in the intermediate-part process stage is greater than that in the center process stage. Further, a processed area of the process-target surface 18b in the outer-edge process stage is greater than that in the intermediate-part process stage. Therefore, a time period taken for the outer-edge process stage is preferably set to be longer than a time period taken for the center process stage. This makes it possible to process the entire process-target surface 18b more uniformly.

(Rotation Process Step)

According to the rotation process step of the present embodiment, in a state where the process-target object 18 is being rotated together with the mounting section 10, the first processing liquid is supplied from the supply opening 56 onto the process-target surface 18b, while the second processing liquid is supplied onto the outer peripheral part 18a. During this operation, the processing jig 50 is moved along a direction which is not the direction along which the process-target object 18 is being rotated.

Namely, in the rotation process step, in a state where the rotation motor 14 is rotating the process-target object 18, the first processing liquid supplying section 40 supplies the first processing liquid from the supply opening 56 onto the process-target surface 18b, while the second processing liquid supplying section 30 supplies the second processing liquid onto the outer peripheral part 18a. Further, the position control section 76 causes the processing jig 50 to move along a direction which is not the direction along which the process-target object 18 is being rotated.

The second processing liquid is a liquid for forming a liquid film of the second processing liquid on the outer peripheral part 18a so as to protect the outer peripheral part 18a from the first processing liquid. For example, in the case where, as described above, the purpose is to clear away the adhesive remaining on the surface of the process-target object 18, which is the semiconductor wafer 94 bonded to the dicing tape 96, the second processing liquid may be a liquid which does not deteriorate the dicing tape 96. For example, pure water is suitably used as the second processing liquid.

Figure 5:
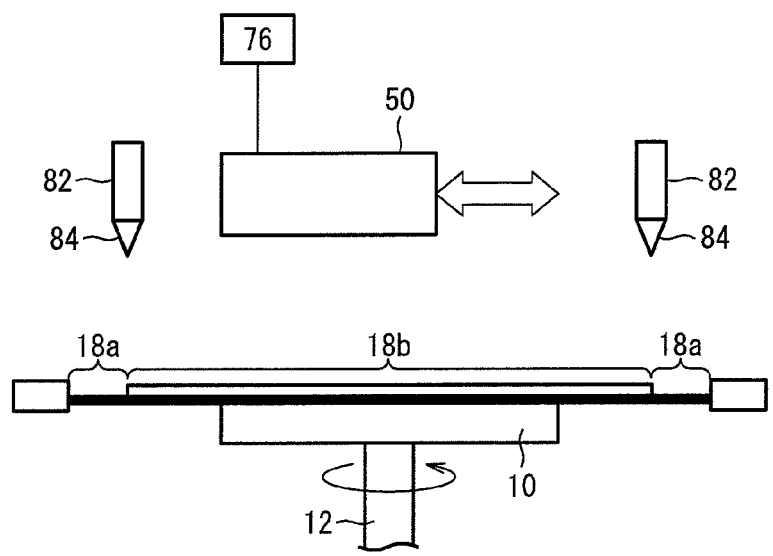
FIG. 5 shows a cross-section view schematically illustrating a main part of the processing device of FIG. 1 in a rotation process step.

FIG. 5 is a cross-section view illustrating a state of the processing device 100 in the rotation process step. As shown in FIG. 5, in the rotation process step, the second processing liquid can be supplied to the outer peripheral part 18a in such a manner that the second processing liquid is supplied (discharged) from the second processing liquid supply opening 84 to a substantial boundary between the process-target surface 18b and the outer peripheral part 18a. Note that the substantial boundary refers to (i) a boundary between the process-target surface 18b and the outer peripheral part 18a and (ii) the surroundings of the boundary. Supplying the second processing liquid to the substantial boundary between the process-target surface 18b and the outer peripheral part 18a while rotating the process-target object 18 allows the second processing liquid to be spread to the outer peripheral part 18a due to centrifugal force, thereby forming the liquid film of the second processing liquid on the outer peripheral part 18a. This can prevent (i) a case where the outer peripheral part 18a is deteriorated by being in contact with the first processing liquid and (ii) a case where the dissolution residual 97 sticks to the outer peripheral part 18a.

As shown in FIG. 1, the second processing liquid supply opening 84 is connected via the pipe 82 to the second processing liquid supplying section 30 which supplies the second processing liquid. The second processing liquid supplying section 30 is provided with a tank (not illustrated) for holding the second processing liquid. The second processing liquid supply opening 84 may be a hole or a nozzle provided to the pipe 82.

Further, according to the method of the present embodiment for processing the process-target object, in the rotation process step, the processing jig 50 is moved along a direction which is not the direction along which the process-target object 18 is being rotated. As indicated in the below-described Examples, this makes it possible to process the process-target surface 18b more effectively than in a case where the process is carried out with the processing jig 50 fixed. Namely, in a case where the method of the present embodiment for processing the process-target object is used to clean away the adhesive remaining on the surface of the process-target object 18, it is possible to successfully remove the dissolution residual 97 from the process-target surface 18b, even if any type of bump 95 is formed on the process-target surface 18b.

As shown in FIG. 5, a distance between the processing jig 50 and the process-target surface 18b in the rotation process step is preferably greater than that in the storage process step. The reason for this is as follows: The storage process step is carried out with the first processing liquid stored in the storage space section 52, whereas a purpose of the rotation process step is to supply the first processing liquid to the process-target surface 18b without storing the first processing liquid. In the method of the present embodiment for processing the process-target object, after the storage process step is carried out, the position control section 76 increases the distance between the processing jig 50 and the process-target surface 18b, and then the rotation process step is carried out. Note that the distance between the processing jig 50 and the process-target surface 18b in the rotation process step is not particularly limited, as long as it does not allow the first processing liquid to be held.

In the rotation process step, the process-target object 18 is rotated preferably at a rotating speed of 100 $\text{min}^{-1}$ or more and less than 1000 $\text{min}^{-1}$, more preferably at a rotating speed of 100 $\text{min}^{-1}$ or more and not more than 500 $\text{min}^{-1}$, particularly preferably at a rotating speed of 100 $\text{min}^{-1}$ or more and not more than 300 $\text{min}^{-1}$. By rotating, in the rotation process step, the process-target object 18 at a rotating speed within the above range, it is possible to process the process-target surface 18b effectively. For example, in a case where the method of the present embodiment for processing the process-target object is used to clean away the adhesive remaining on the surface of the process-target object 18, rotating, in the rotation process step, the process-target object 18 at a rotating speed within the above range makes it possible to remove the dissolution residual 97 from the process-target surface 18b more suitably.

A flow rate of the first processing liquid supplied from the supply opening 56 in the rotation process step is preferably greater than that in the storage process step. By adjusting the flow rate of the first processing liquid as such, it is possible to process the process-target surface 18b more effectively. For example, in a case where the method of the present embodiment for processing the process-target object is used to clean away the adhesive remaining on the surface of the process-target object 18, adjusting the flow rate of the first processing liquid as above makes it possible to remove the dissolution residual 97 from the process-target surface 18b more suitably, even if any type of bump 95 is formed on the process-target surface 18b.

Embodiment 2

Next, the following will describe Embodiment 2 of the present invention. According to a method of the present embodiment for processing a process-target object, after the storage process step and the rotation process step, each of which has been described in Embodiment 1, are carried out, (i) a spray process step for preparing a mixture of the first processing liquid and a gas and spraying the mixture onto the process-target surface and (ii) a dry step for drying the process-target surface by supplying a gas onto the process-target surface are further carried out. The storage process step and the rotation process step may be carried out in the same manner as in Embodiment 1, and therefore explanations thereof are omitted here. The following will describe the spray process step and the dry step.

(Spray Process Step)

In the spray process step, the first processing liquid is mixed with a gas, and the resulting mixture is sprayed onto the process-target surface 18b. Namely, in the spray process step, the processing device 100 mixes (i) the first processing liquid stored in the tank (not illustrated) with (ii) the gas, and sprays the resulting mixture onto the process-target surface 18b. This makes it possible to carry out a cleaning process on the process-target surface 18b more effectively.

Note that the gas and the first processing liquid may be mixed and sprayed by, for example, a publicly-known two fluid nozzle. The gas can be, for example, $N_2$ or air.

(Dry Step)

In the dry step, a gas is supplied onto the process-target surface 18b, so that the process-target surface 18b is dried. Namely, in the dry step, the processing device 100 causes the gas to be supplied from a predetermined nozzle to the process-target surface 18b. The gas may be, for example, $N_2$. However, the present invention is not limited to this. In the dry step, the gas is supplied onto the process-target surface 18b, so that the process-target surface 18b is dried. This makes it possible to dry the process-target object 18 quickly and reliably, while (i) preventing a foreign object, etc. from sticking onto the process-target surface 18b and (ii) maintaining cleanness of the process-target surface 18b.

The present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

Next, the following will describe greater details of the present invention with reference to Examples and Comparative Examples.

The purpose of each of Examples and Comparative Examples was to clean a process-target surface 18b of a process-target object 18. Used as the process-target object 18 was a semiconductor wafer whose diameter was 30 cm and to which a dicing tape was bonded. The semiconductor wafer had a remaining adhesive 93 of approximately 140 µm in thickness and dissolution residual (powder) 97. The semiconductor wafer had a circuit-formed surface (process-target surface 18b) provided with a metal electrode projection (bump 95). Used as a first processing liquid was an organic solvent (p-menthane). Used as a second processing liquid was pure water.

Comparative Example 1

In Comparative Example 1, while a process-target object 18 was being rotated, the process-target object 18 was processed merely by supplying a first processing liquid onto a process-target surface 18b; thereafter, the process-target object 18 was rotated with no first processing liquid supplied, so that the process-target object 18 was dried. Used as the process-target object 18 were (i) a semiconductor wafer provided with a bump of 60 µm in height and (ii) a semiconductor wafer provided with a bump of 80 µm in height.

First, a distance between a processing jig 50 and the process-target surface 18b was set to and kept at 12 cm, and the first processing liquid was supplied at a flow rate of 50 ml/min in a state where the process-target object 18 was being rotated sequentially under the following six conditions: (1) at a rotating speed of 1000 min$^{-1}$ for 20 seconds; (2) at a rotating speed of 1000 min$^{-1}$ for 900 seconds; (3) at a rotating speed of 1000 min$^{-1}$ for 900 seconds; (4) at a rotating speed of 1000 min$^{-1}$ for 900 seconds; (5) at a rotating speed of 700 min$^{-1}$ for 900 seconds; and (6) at a rotating speed of 700 min$^{-1}$ for 10 seconds. Subsequently, the process-target object 18 was rotated at a rotating speed of 700 min$^{-1}$ for three minutes, so that the process-target object 18 was dried.

The process-target object 18 processed as above was visually observed, and the results of the process were evaluated.

A remaining adhesive 93 had been removed from the process-target surface 18b of the resulting process-target object 18. However, dissolution residual 97 remained thereon (see (a) of FIG. 8). Further, an outer peripheral part 18a (an exposed surface of a dicing tape 96) was expanded by the first processing liquid used in the rotation process, and was deflected. Furthermore, a large amount of dissolution residual 97 was stuck to the exposed surface of the dicing tape 96.

These results show that, in a case where the process-target object 18 having the remaining adhesive 93 and the dissolution residual 97 is processed merely by supplying the first processing liquid to the process-target surface 18b while rotating the process-target object 18, sufficient cleaning effects cannot be obtained, and an outer peripheral part 18a (dicing tape 96) is deteriorated.

Comparative Example 2

In Comparative Example 2, after a process-target object 18 was subjected to a storage process step and a rotation process step, the process-target object 18 was finally rotated with no processing liquid supplied, so that the process-target object 18 was dried. The rotation process step was carried out with a processing jig 50 fixed. Used as the process-target object 18 were (i) a semiconductor wafer provided with a bump of 60 µm in height and (ii) a semiconductor wafer provided with a bump of 80 µm in height.

First, a distance between the processing jig 50 and a process-target surface 18b was set to and kept at 300 µm, and a first processing liquid was supplied/collected to/from a storage space section 52 at a flow rate of 50 ml/min in a state where the process-target object 18 was being rotated and the processing jig 50 was positioned sequentially under the following five conditions: (1) the process-target object 18 was being rotated at a rotating speed of 10 min$^{-1}$ for 20 seconds with the processing jig 50 positioned above a center of the process-target surface 18b; (2) the process-target object 18 was being rotated at a rotating speed of 10 min$^{-1}$ for 900 seconds with the processing jig 50 positioned above an intermediate part of the process-target surface 18b; (3) the process-target object 18 was being rotated at a rotating speed of 10 min$^{-1}$ for 900 seconds with the processing jig 50 positioned above an outer edge of the process-target surface 18b; (4) the process-target object 18 was being rotated at a rotating speed of 10 min$^{-1}$ for 900 seconds with the processing jig 50 positioned above the intermediate part of the process-target surface 18b; and (5) the process-target object 18 was being rotated at a rotating speed of 10 min$^{-1}$ for 900 seconds with the processing jig 50 positioned above the outer edge of the process-target surface 18b.

Subsequently, the processing jig 50 was moved to and kept at a position which was upwardly apart from the center of the process-target surface 18b by 12 cm. Then, while the process-target object 18 was being rotated at a rotating speed of 1000 min$^{-1}$ for 10 seconds, a second processing liquid was supplied from a second processing liquid supply opening 84 to a substantial boundary between the process-target surface 18b and an outer peripheral part 18a, and the first processing liquid was supplied from a supply opening 56 to the process-target surface 18b at a flow rate of 50 ml/min. In this Comparative Example, since keeping the processing jig 50 at the position apart from the process-target surface 18b by approximately 12 cm causes the processing jig 50 to interfere with the second processing liquid supply opening 84 due to the structure of a processing device 100, the processing jig 50 was positioned merely at an upper position of the center of the process-target surface 18b and could not be positioned in any other upper position.

Finally, the process-target object 18 was rotated at a rotating speed of 1000 min$^{-1}$ for 180 seconds, so that the process-target object 18 was dried.

The process-target object 18 processed as above was visually observed, and the results of the process were evaluated.

The solvent was dried uniformly on the process-target surface 18b of the resulting process-target object 18, and a remaining adhesive 93 had been removed therefrom. However, a large amount of dissolution residual 97 remained thereon (see (b) of FIG. 8). Meanwhile, an outer peripheral part 18a (an exposed surface of a dicing tape 96) hardly had a damage caused by the solvent or dissolution residual 97 stuck thereto.

These results show that, in a case where the process-target object 18 having the remaining adhesive 93 and the dissolution residual 97 is subjected merely to the storage process step and the rotation process step, sufficient cleaning effects cannot be obtained.

Comparative Example 3

In Comparative Example 3, a process-target object 18 was processed in such a manner that a rotating speed in a rotation process was reduced as compared with that of Comparative Example 2. Used as the process-target object 18 were (i) a semiconductor wafer provided with a bump of 60 μm in height and (ii) a semiconductor wafer provided with a bump of 80 μm in height.

First, a distance between the processing jig 50 and a process-target surface 18b was set to and kept at 300 μm, and a first processing liquid was supplied/collected to/from a storage space section 52 at a flow rate of 50 ml/min in a state where the process-target object 18 was being rotated and the processing jig 50 was positioned sequentially under the following five conditions: (1) the process-target object 18 was being rotated at a rotating speed of 10 min$^{-1}$ for 20 seconds with the processing jig 50 positioned above a center of the process-target surface 18b; (2) the process-target object 18 was being rotated at a rotating speed of 10 min$^{-1}$ for 600 seconds with the processing jig 50 positioned above an intermediate part of the process-target surface 18b; (3) the process-target object 18 was being rotated at a rotating speed of 10 min$^{-1}$ for 600 seconds with the processing jig 50 positioned above an outer edge of the process-target surface 18b; (4) the process-target object 18 was being rotated at a rotating speed of 10 min$^{-1}$ for 600 seconds with the processing jig 50 positioned above the intermediate part of the process-target surface 18b; and (5) the process-target object 18 was being rotated at a rotating speed of 10 min$^{-1}$ for 600 seconds with the processing jig 50 positioned above the outer edge of the process-target surface 18b.

Subsequently, the processing jig 50 was moved to and kept at a position which was upwardly apart from the center of the process-target surface 18b by 12 cm. Then, while the process-target object 18 was being rotated at a rotating speed of 200 min$^{-1}$ for 360 seconds, a second processing liquid was supplied from a second processing liquid supply opening 84 to a substantial boundary between the process-target surface 18b and an outer peripheral part 18a, and the first processing liquid was supplied from a supply opening 56 to the process-target surface 18b at a flow rate of 50 ml/min. In this Comparative Example, since keeping the processing jig 50 at the position apart from the process-target surface 18b by approximately 12 cm causes the processing jig 50 to interfere with the second processing liquid supply opening 84 due to the structure of a processing device 100, the processing jig 50 was positioned merely at an upper position of the center of the process-target surface 18b and could not be positioned in any other upper position.

Finally, the process-target object 18 was rotated at a rotating speed of 1000 min$^{-1}$ for 300 seconds, so that the process-target object 18 was dried.

The process-target object 18 processed as above was visually observed, and the results of the process were evaluated.

Figure 8:
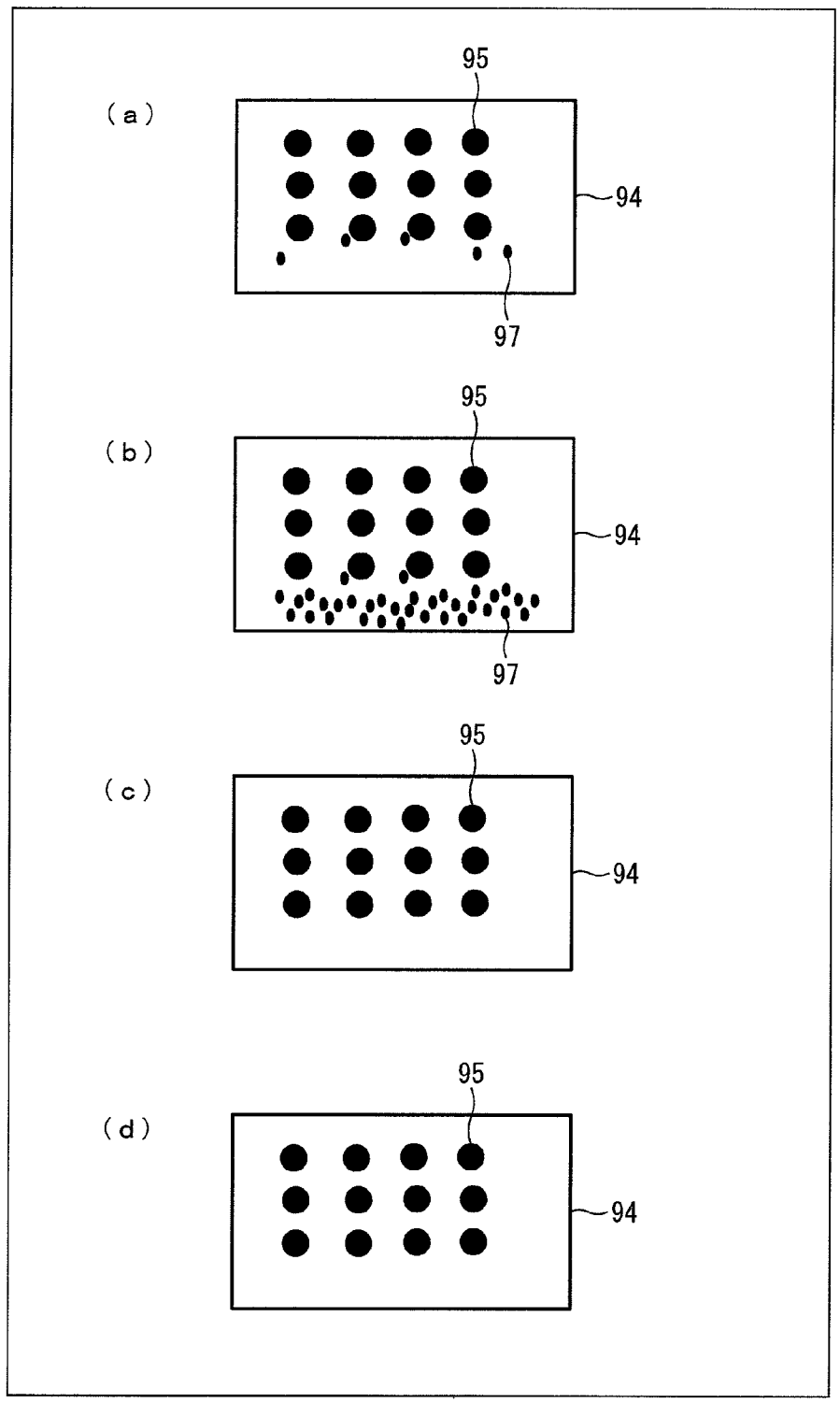
FIG. 8 shows top views illustrating results of processes carried out on process-target objects. (a), (b), and (c) of FIG. 8 show results of Comparative Examples, whereas (d) of FIG. 8 shows a result of Example.

A remaining adhesive 93 had been removed from the process-target surface 18b of the process-target object 18 provided with the bump of 60 μm, and no dissolution residual 97 was stuck thereto (see (c) of FIG. 8). Further, an outer peripheral part 18a (an exposed surface of a dicing tape 96) hardly had a damage caused by the solvent and dissolution residual 97 stuck thereto.

Meanwhile, on the process-target surface 18b of the process-target object 18 provided with the bump of 80 μm, dissolution residual 97 remained around the bump.

These results show that, in a case where the process-target object 18 having the remaining adhesive 93 and the dissolution residual 97 is subjected merely to the storage process step and the rotation process step, carrying out the rotation process step with a lower rotating speed and a longer process period enhances cleaning effects, but the cleaning effects obtained are still insufficient.

Example 1

In Example 1, a storage process step and a rotation process step were carried out on a process-target object 18, and thereafter the process-target object 18 was finally rotated with no processing liquid supplied, so that the process-target object 18 was dried. The rotation process step was carried out in such a manner that a processing jig 50 was caused to swing along a radial direction of the process-target object 18. Used as the process-target object 18 were (i) a semiconductor wafer provided with a bump of 60 μm in height and (ii) a semiconductor wafer provided with a bump of 80 μm in height.

First, a distance between the processing jig 50 and a process-target surface 18b was set to and kept at 300 μm, and a first processing liquid was supplied/collected to/from a storage space section 52 at a flow rate of 50 ml/min in a state where the process-target object 18 was being rotated and the processing jig 50 was positioned sequentially under the following five conditions: (1) the process-target object 18 was being rotated at a rotating speed of 10 min$^{-1}$ for 20 seconds with the processing jig 50 positioned above a center of the process-target surface 18b; (2) the process-target object 18 was being rotated at a rotating speed of 10 min$^{-1}$ for 600 seconds with the processing jig 50 positioned above an intermediate part of the process-target surface 18b; (3) the process-target object 18 was being rotated at a rotating speed of 10 min$^{-1}$ for 600 seconds with the processing jig 50 positioned above an outer edge of the process-target surface 18b; (4) the process-target object 18 was being rotated at a rotating speed of 10 min$^{-1}$ for 300 seconds with the processing jig 50 positioned above the intermediate part of the process-target surface 18b; and (5) the process-target object 18 was being rotated at a rotating speed of 10 min$^{-1}$ for 300 seconds with the processing jig 50 positioned above the outer edge of the process-target surface 18b.

Subsequently, the processing jig 50 was moved to and kept at a position which was upwardly apart from the center of the process-target surface 18b by 12 cm. Then, while the process-target object 18 was being rotated at a rotating speed of 150 min$^{-1}$ for 420 seconds, a second processing liquid was supplied from a second processing liquid supply opening 84 to a substantial boundary between the process-target surface 18b and an outer peripheral part 18a, and the first processing liquid was supplied from a supply opening 56 to the process-target surface 18b at a flow rate of 150 ml/min. During this operation, the processing jig 50 was caused to swing along a radial direction of the process-target object 18 at a width of 130 mm.

Finally, the process-target object 18 was rotated at a rotating speed of 1200 min$^{-1}$ for 300 seconds, so that the process-target object 18 was dried.

The process-target object 18 processed as above was visually observed, and the results of the process were evaluated.

A remaining adhesive 93 had been removed from the process-target surface 18b of the resulting process-target object 18, and no dissolution residual 97 was stuck thereto (see (d) of FIG. 8). Further, an outer peripheral part 18a (an exposed surface of a dicing tape 96) hardly had a damage caused by the solvent or dissolution residual 97 stuck thereto.

These results show that, in a case where the process-target object 18 having the remaining adhesive 93 and the dissolution residual 97 is subjected to the storage process step and the rotation process step in which the processing jig 50 is being moved, sufficient cleaning effects can be obtained without causing deterioration of the dicing tape.

Example 2

In Example 2, a storage process step and a rotation process step were carried out on a process-target object 18, and thereafter a spray process step and a dry step were carried out. Finally, the process-target object 18 was rotated with no processing liquid supplied, so that the process-target object 18 was dried. The rotation process step was carried out in such a manner that a processing jig 50 was caused to swing along a radial direction of the process-target object 18.

First, a distance between the processing jig 50 and a process-target surface 18b was set to and kept at 300 μm, and a first processing liquid was supplied/collected to/from a storage space section 52 at a flow rate of 50 ml/min in a state where the process-target object 18 was being rotated and the processing jig 50 was positioned sequentially under the following five conditions: (1) the process-target object 18 was being rotated at a rotating speed of 10 $min^{-1}$ for 20 seconds with the processing jig 50 positioned above a center of the process-target surface 18b; (2) the process-target object 18 was being rotated at a rotating speed of 10 $min^{-1}$ for 600 seconds with the processing jig 50 positioned above an intermediate part of the process-target surface 18b; (3) the process-target object 18 was being rotated at a rotating speed of 10 $min^{-1}$ for 600 seconds with the processing jig 50 positioned above an outer edge of the process-target surface 18b; (4) the process-target object 18 was being rotated at a rotating speed of 10 $min^{-1}$ for 300 seconds with the processing jig 50 positioned above the intermediate part of the process-target surface 18b; and (5) the process-target object 18 was being rotated at a rotating speed of 10 $min^{-1}$ for 300 seconds with the processing jig 50 positioned above the outer edge of the process-target surface 18b.

Subsequently, the processing jig 50 was moved to and kept at a position which was upwardly apart from the center of the process-target surface 18b by 12 cm. Then, while the process-target object 18 was being rotated at a rotating speed of 150 $min^{-1}$ for 420 seconds, a second processing liquid was supplied from a second processing liquid supply opening 84 to a substantial boundary between the process-target surface 18b and an outer peripheral part 18a, and the first processing liquid was supplied from a supply opening 56 to the process-target surface 18b at a flow rate of 150 ml/min. During this operation, the processing jig 50 was caused to swing along a radial direction of the process-target object 18 at a width of 130 mm.

Subsequently, the process-target object 18 was rotated at a rotating speed of 1000 $min^{-1}$. In this state, while pure water was being supplied to the substantial boundary between the process-target surface 18b and the outer peripheral part 18a, a two fluid spray prepared by mixing the first processing liquid and $N_2$ was sprayed onto the process-target surface 18b. In this manner, the spray process step was carried out for 60 through 120 seconds.

The process-target object 18 was rotated at a rotating speed of 1200 $min^{-1}$. In this state, $N_2$ was blown to the process-target surface 18b. In this manner, the dry step was carried out by means of air-blow for 30 seconds. The beginning of the dry step may be carried out while pure water is being supplied to the substantial boundary.

Finally, the process-target object 18 was rotated at a rotating speed of 1200 $min^{-1}$ for 300 seconds, so that the process-target object 18 was dried.

The process-target object 18 processed as above was visually observed, and the results of the process were evaluated.

A remaining adhesive 93 had been removed from the process-target surface 18b of the resulting process-target object 18, and no dissolution residual 97 was stuck thereto. Further, an outer peripheral part 18a (an exposed surface of a dicing tape 96) hardly had a damage caused by the solvent or dissolution residual 97 stuck thereto.

These results show that, in a case where the process-target object 18 having the remaining adhesive 93 and the dissolution residual 97 is subjected to (i) the storage process step, (ii) the rotation process step in which the processing jig 50 is being moved, (iii) the spray process step, and (iv) the dry step by means of air-blow, sufficient cleaning effects can be obtained without causing deterioration of the dicing tape.

INDUSTRIAL APPLICABILITY

The present invention is applicable to, for example, a surface treatment of a thinned semiconductor wafer.

REFERENCE SIGNS LIST

10 Mounting section
12 Rotation shaft
14 Rotation motor
18 Process-target object
18a Outer peripheral part
18b Process-target surface
30 Second processing liquid supplying section
40 First processing liquid supplying section
50 Processing jig
52 Storage space section
54 Projection
56 Supply opening
58 Collection opening
70 First processing liquid collecting section
76 Position control section
84 Second processing liquid supply opening
93 Remaining adhesive
94 Semiconductor wafer
95 Bump
96 Support
97 Dissolution residual

The invention claimed is:

1. A method for processing a process-target object, the process-target object having a process-target surface and an outer peripheral part which is provided along an outer periphery of the process-target surface, said method comprising the steps of:

carrying out a storage process by causing a processing jig, which has a supply opening for supplying a first processing liquid, to be positioned such that a space into which the supply opening is open is sandwiched by the processing jig and the process-target surface, and by storing the first processing liquid in said space; and carrying out a rotation process by supplying the first processing liquid onto the process-target surface from the supply opening, while supplying a second processing liquid onto the outer peripheral part, in a state where the process-target object is being rotated, wherein:

in the step for carrying out the rotation process, the processing jig is moved along a direction which is not a direction along which the process-target object is being rotated;

in the step for carrying out the storage process, a region of the process-target surface which region is in contact with said space is smaller than the entire process-target surface; and in the step for carrying out the storage process, the processing jig is moved along a direction which is in parallel with the process-target surface.

2. The method as set forth in claim 1, wherein:
a distance between the processing jig and the process-target surface in the step for carrying out the rotation process is greater than that in the step for carrying out the storage process.

3. The method as set forth in claim 1, wherein:
in the step for carrying out the rotation process, the process-target object is being rotated at a rotating speed within a range from 100 $min^{-1}$ or more and less than 1000 $min^{-1}$.

4. The method as set forth in claim 1, wherein:
in the step for carrying out the rotation process, the first processing liquid is supplied from the supply opening at a flow rate greater than that in the step for carrying out the storage process.

5. The method as set forth in claim 1, wherein:
in the step for carrying out the rotation process, the second processing liquid is supplied onto the outer peripheral part in such a manner that the second processing liquid is supplied to a substantial boundary between the process-target surface and the outer peripheral part.

6. The method as set forth in claim 1, further comprising the step of, after the step for carrying out the rotation process:
carrying out a spray process by preparing a mixture of the first processing liquid and a gas and by spraying the mixture onto the process-target surface.

7. The method as set forth in claim 1, further comprising the step of, after the step for carrying out the rotation process:
drying the process-target surface by supplying a gas onto the process-target surface.

8. The method as set forth in claim 1, wherein:
the step for carrying out the storage process includes:
a center process stage for positioning the processing jig above a center of the process-target surface; and
an outer-edge process stage for positioning the processing jig above an outer edge of the process-target surface, and
a time period taken for the outer-edge process stage is longer than a time period taken for the center process stage.

9. The method as set forth in claim 1, wherein:
the processing jig has a collection opening which is configured to be, in the step for carrying out the storage process, open into said space so as to collect the first processing liquid; and
in the step for carrying out the storage process, the processing jig is kept so as not to come in contact with the process-target surface.

10. The method as set forth in claim 1, wherein:
the process-target object is a substrate which is bonded to a support;
the process-target surface is a surface of the substrate; and
the outer peripheral part is an exposed surface of the support.

11. The method as set forth in claim 1, wherein:
the first processing liquid is a solvent for dissolving an adhesive applied onto the process-target surface, and dissolution residual, which is insoluble in the solvent, remains on the process-target surface in a case where the adhesive is dissolved in the solvent.

12. A method for processing a process-target object, the process-target object having a process-target surface and an outer peripheral part which is provided along an outer periphery of the process-target surface,
said method comprising the steps of:
carrying out a storage process by causing a processing jig, which has a supply opening for supplying a first processing liquid, to be positioned such that a space into which the supply opening is open is sandwiched by the processing jig and the process-target surface, and by storing the first processing liquid in said space; and
carrying out a rotation process by supplying the first processing liquid onto the process-target surface from the supply opening, while supplying a second processing liquid onto the outer peripheral part, in a state where the process-target object is being rotated, wherein:
in the step for carrying out the rotation process, the processing jig is moved along a direction which is not a direction along which the process-target object is being rotated;
the processing jig has a collection opening which is configured to be, in the step for carrying out the storage process, open into said space so as to collect the first processing liquid; and
in the step for carrying out the storage process, the processing jig is kept so as not to come in contact with the process-target surface.

13. The method as set forth in claim 12, wherein:
a distance between the processing jig and the process-target surface in the step for carrying out the rotation process is greater than that in the step for carrying out the storage process.

14. The method as set forth in claim 12, wherein:
in the step for carrying out the rotation process, the process-target object is being rotated at a rotating speed within a range from 100 $min^{-1}$ or more and less than 1000 $min^{-1}$.

15. The method as set forth in claim 12, wherein:
in the step for carrying out the rotation process, the first processing liquid is supplied from the supply opening at a flow rate greater than that in the step for carrying out the storage process.

16. The method as set forth in claim 12, wherein:
in the step for carrying out the rotation process, the second processing liquid is supplied onto the outer peripheral part in such a manner that the second processing liquid is supplied to a substantial boundary between the process-target surface and the outer peripheral part.

17. The method as set forth in claim 12, further comprising the step of, after the step for carrying out the rotation process:
carrying out a spray process by preparing a mixture of the first processing liquid and a gas and by spraying the mixture onto the process-target surface.

18. The method as set forth in claim 12, further comprising the step of, after the step for carrying out the rotation process:
drying the process-target surface by supplying a gas onto the process-target surface.

19. The method as set forth in claim 12, wherein:
the process-target object is a substrate which is bonded to a support;
the process-target surface is a surface of the substrate; and
the outer peripheral part is an exposed surface of the support.

20. The method as set forth in claim 12, wherein:
the first processing liquid is a solvent for dissolving an adhesive applied onto the process-target surface, and dissolution residual, which is insoluble in the solvent, remains on the process-target surface in a case where the adhesive is dissolved in the solvent.

* * * * *